United States Patent [19]

Takahashi

[11] Patent Number: 5,317,362
[45] Date of Patent: May 31, 1994

[54] CONTROL CIRCUIT FOR CAMERA HAVING AUXILIARY LIGHT SOURCE

[75] Inventor: Minoru Takahashi, Omiya, Japan

[73] Assignee: Fuji Photo Optical Co., Ltd., Saitama, Japan

[21] Appl. No.: 897,287

[22] Filed: Jun. 11, 1992

[30] Foreign Application Priority Data

Jun. 13, 1991 [JP] Japan ................. 3-168835
Jun. 13, 1991 [JP] Japan ................. 3-168836
Jun. 13, 1991 [JP] Japan ................. 3-168837

[51] Int. Cl.$^5$ .................. G03B 15/05; G03B 7/26
[52] U.S. Cl. .................. 354/418; 354/415; 354/484; 354/127.12
[58] Field of Search ........... 354/415, 484, 418, 127.12, 354/468, 127.1

[56] References Cited

U.S. PATENT DOCUMENTS

| | | | |
|---|---|---|---|
| 4,269,494 | 5/1981 | Shiozawa et al. | 354/484 X |
| 4,376,265 | 3/1983 | Kiuchi et al. | 354/468 X |
| 4,502,774 | 3/1985 | Suzuki et al. | 354/468 X |
| 4,630,916 | 12/1986 | Ishiguro et al. | 354/418 |
| 4,799,078 | 1/1989 | Hayama | 354/484 X |
| 4,982,220 | 1/1991 | Akasaka | 354/468 |
| 5,159,379 | 10/1992 | Shirane et al. | 354/415 |

Primary Examiner—Michael L. Gellner
Assistant Examiner—Jae N. Noh
Attorney, Agent, or Firm—Ronald R. Snider

[57] ABSTRACT

A control circuit for a camera having an auxiliary light source for preventing a red-eye phenomenon separately from an electronic flash light source. When the red-eye preventing mode for emitting light from the auxiliary light source is selected, the battery is checked after the ordinary judging level is switched over to a higher judging level. At ordinary time, the voltage of the battery is checked while applying a dummy current to a predetermined driving portion of said camera, and when the red-eye preventing mode is selected, the voltage of the battery voltage is checked while applying the dummy current to another driving portion in addition to the predetermined driving portion. Thus, auxiliary electronic flashing is secured and the battery is used effectively. By utilizing the auxiliary light source for controlling both preliminary electronic flashing for preventing the red-eye phenomenon and auxiliary electronic flashing for passive autofocusing, the auxiliary light source is effectively used.

2 Claims, 6 Drawing Sheets

CONTROL CIRCUIT FOR CAMERA HAVING AUXILIARY LIGHT SOURCE

BACKGROUND OF THE INVENTION

This application claims the priority of Japanese Patent Application Nos. 3-168835, 3-168836 and 3-168837 filed on Jun. 13, 1991, which is incorporated herein by reference.

FIELD OF THE INVENTION

The present invention relates to a control circuit for a camera provided with an auxiliary light source especially for preventing a red-eye phenomenon in addition to an electronic flash light source.

DESCRIPTION OF THE RELATED ART

Photography with an electronic flash suffers from a problem of what is called a red-eye phenomenon. That is, the eyes of the object come out red in the printed photograph. The red-eye phenomenon is produced because when an electronic flash is emitted toward the object such as a man and an animal, the light which enters the eyeballs from the pupils is reflected from the blood vessels in the eyeballs, so that the eyes themselves come out red in the printed photograph. In order to prevent this phenomenon, a method of reducing the diameters of the pupils by emitting a weak electronic flash prior to photographing (preliminary electronic flashing) so as to reduce the amount of light entering the eyeballs has recently been adopted.

In the case of preliminary electronic flashing by the use of a lamp provided in a camera, a method of emitting an electronic flash from a lamp such as a xenon tube by using capacitor with different (large and small) capacities has been proposed. However, this method is disadvantageous in that the complicated control for charging and discharging the capacitors having large and small capacities is required. To dispense with this complicated control, a method of providing an auxiliary light source separately from an electronic flash light source has been proposed. According to this method, a preliminary electronic flash is emitted from the auxiliary light source in synchronism with the shutter button, and after reducing the diameter of the pupils, a photograph is taken with an electronic flash emitted from the electronic flash light source.

A battery is used in a camera as a driving source for various operations, and the capacity of the battery is constantly checked so as to enable good basic operations such as photographing with an electronic flash and a film feeding operation.

In the above-described camera having the auxiliary light source, the electric power for driving the auxiliary light source is larger than the electric power for any other driving portion, so that the conventional battery check is insufficient for a camera having an auxiliary light source. More specifically, since a lamp which emits light having a comparatively large light flux is used as the auxiliary light source and about 1 sec is required until the eyeballs react to the light, which prevents, an red-eye phenomenon, a larger electric power (e.g., about 600 mA) is required for driving the auxiliary light source than the electric power for driving another driving portion. For example, in the case of an electronic flash light source, the power for emitting light is large, but after a capacitor is charged, light is emitted from a xenon tube with the charged power. The electric power for charging the capacitor is smaller than the electric power for emitting light from the auxiliary light source. The electric power required by the auxiliary light source is therefore larger than that for the electronic flash light source.

The level for the battery check of a camera is generally set at as low a level as possible so as to enable many shots of photographing in the state in which the function and the capability of the camera are satisfied. If the auxiliary light source is accommodated in a camera under such a circumstance, the amount of light emitted from the auxiliary light source is sometimes insufficient for preventing a red-eye phenomenon. In some cases, although a sufficient amount of light is emitted from the auxiliary light source, a problem is caused in the subsequent driving portion. For example, even if the battery is judged to be in a good state by a battery check, basic operations after the light emission from the auxiliary light source such as electronic flashing at the time of exposure and feeding the film after photographing are sometimes impossible.

Passive AF control carried out under stationary light by using a line sensor such as a CCD (charged coupled device), which is a solid-state image sensor, is known as one of the autofocusing (AF) controlling methods for a camera. In this passive AF control, since focusing is carried out in a bright place unlike active AF control using infrared light or the like, focusing is impossible in a dark place. For this reason, an auxiliary light source such as a lamp and an LED is conventionally provided in addition to an electronic flash light so as to enable autofocusing control even in a pitch-dark state by virtue of the auxiliary light source.

In a conventional camera, however, an auxiliary light source for preventing a red-eye phenomenon is provided separately from an auxiliary light source for passive AF, as described above. If one auxiliary light source is used for both purposes, it is possible to produce a functional camera having a simple structure.

SUMMARY OF THE INVENTION

Accordingly, it is a first object of the present invention to eliminate the above-described problems in the related art and to provide a control circuit for a camera having an auxiliary light source which is capable of checking a battery so as to enable good operations including light emission from the auxiliary light source.

It is a second object of the present invention to provide a control circuit for a camera having an auxiliary light source which is capable of electronic flashing both for preventing a red-eye phenomenon and for passive autofocusing with good efficiency by one auxiliary light source.

To achieve the first aim, in a control circuit provided in one aspect of the present invention, when a red-eye preventing mode for emitting light from an auxiliary light source so as to prevent a red-eye phenomenon is selected, a battery is checked after the ordinary judging level is switched over to a higher judging level. In this case, it is possible to provide a comparator for judging the battery level and to switch either the input voltage or the judging reference voltage of the comparator between the one for ordinary time and the one for the red-eye preventing mode. It is possible to set the input voltage or the judging reference voltage of the comparator for by switching the resistors which are connected to the comparator.

For example, a battery check is possible by comparing a voltage obtained by dividing the battery voltage with the reference voltage. In the red-eye preventing mode, the voltage dividing ratio set at ordinary time is switched over to a lower voltage dividing ratio, and the divided voltage is compared with the reference voltage. Therefore, in the red-eye preventing mode, a battery check is carried out in a substantially higher level than the level at ordinary time.

To achieve the first aim, in a control circuit provided in another aspect of the present invention, the battery voltage is checked at ordinary time while applying a dummy current to a predetermined driving portion of a camera. On the other hand, when the red-eye preventing mode is selected, the battery voltage is checked while applying the dummy current to another driving port-ion in addition to the predetermined driving portion. With the dummy current, it is possible to use the current flowing in the drivers for various motors in a camera when the motors are braked.

For example, a pulse motor for driving a shutter is braked so as to generate the dummy current, and a battery check is carried out in this state at ordinary time. When the red-eye preventing mode is selected, a film take-up motor and a zoom motor are also braked in addition to the pulse motor, thereby generating a new dummy current. A larger dummy current than the dummy current at ordinary time is therefore applied for checking in the red-eye preventing mode. That is, a battery check is carried out at a substantially high level.

To achieve the second aim, a control circuit provided in still another aspect of the present invention has an auxiliary light source accommodated in a camera separately from an electronic flash light, and the auxiliary light source emits both preliminary flashing for preventing a red-eye phenomenon and auxiliary flashing for passive autofocusing.

For example, when the first switch of the shutter button is turned on, if the value measured by a photometer is low, light is emitted from the auxiliary light source, so that the auxiliary light is projected to the object during the autofocusing operation. When the red-eye preventing mode is not selected, the auxiliary light is extinguished in several hundred ms, but when the red-eye preventing mode is selected, the light emission state of the auxiliary light source is maintained and the auxiliary light is extinguished when the amount of light becomes sufficient for preventing the red-eye phenomenon.

The above and other objects, features and advantages of the present invention will become clear from the following description of the preferred embodiments thereof, taken in conjunction with the accompanying drawings.

DESCRIPTION OF THE PREFERRED EMBODIMENTS

First Embodiment

Figure 1:
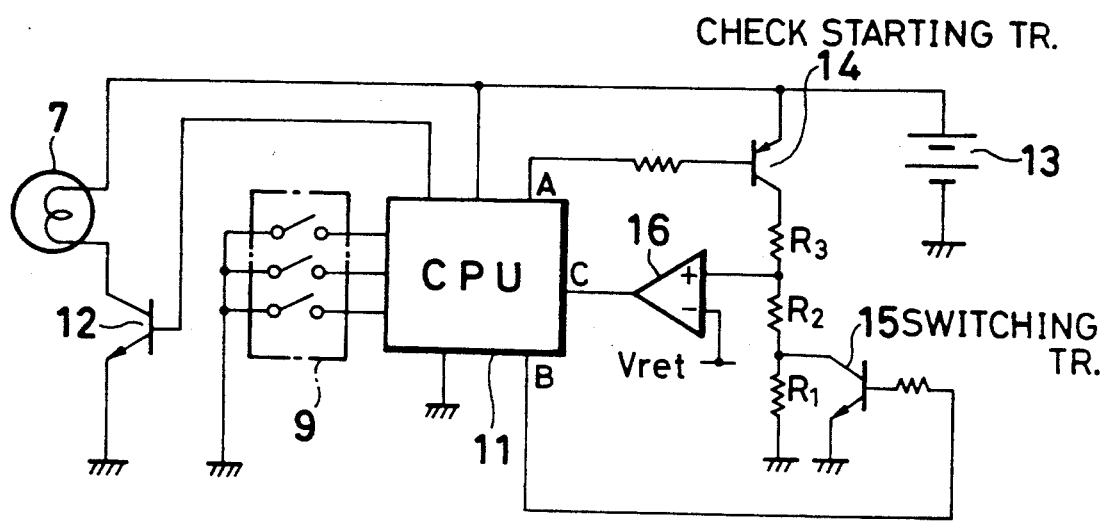
FIG. 1 is a circuit block diagram of the structure of a first embodiment of a control circuit for a camera having an auxiliary light source according to the present invention.
Figure 2:
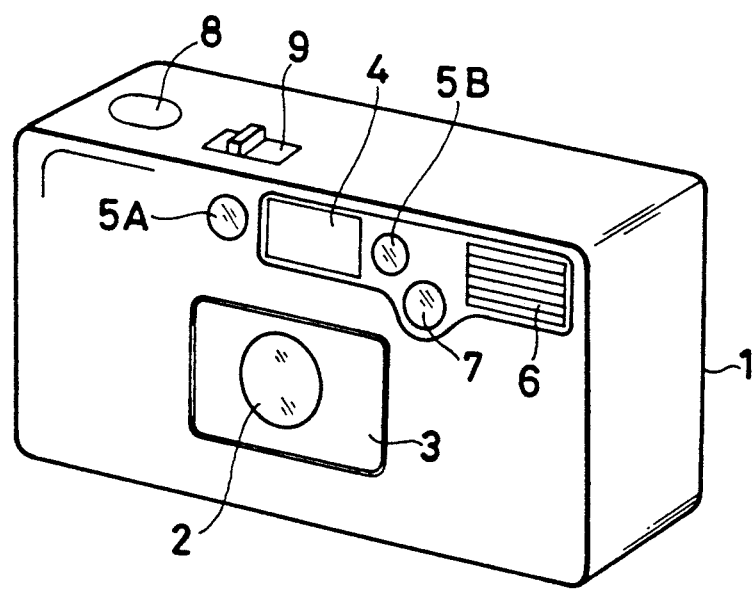
FIG. 2 is a perspective view of the external appearance of the camera in the first embodiment.

FIG. 1 shows the structure of a first embodiment of a control circuit for a camera having an auxiliary light source according to the present invention, and FIG. 2 is an external view of the camera in this embodiment. In FIG. 2, at the front surface of a camera body 1, a lens barrel 3 having a photographing lens 2 is movably disposed. A finder 4, an autofocusing (AF) light projecting window 5A, an AF light receiving window 5B and an electronic light emitting portion 6 accommodating a xenon tube are also provided at the front surface of the camera body 1. An auxiliary light source (lamp) 7 is further disposed between the lens barrel 3 and the electronic light emitting portion 6.

A shutter switch 8 and an electronic flash mode selector switch 9 are disposed on the upper surface of the camera body 1. The shutter button 8 including switches (S1, S2) of two stages carry out the later-described photographing operation. In the electronic flash mode selector switch 9, a knob slides in a groove so as to select one from a red-eye preventing mode, a low luminance automatic emission mode, a forced emission mode such as a daylight synchronized flash mode, etc.

In FIG. 1, a CPU 11 (central processing unit) is provided with the auxiliary lamp 7 through a switching transistor 12, and the other side of the auxiliary lamp 7 is connected to a battery 13 of, for example, 6 V. The electronic flash mode selector switch 9 is connected to the CPU 11 in such a manner that the signal selected by the electronic flash mode selector switch 9 is input to the CPU 11. Autofocussing (AF) portion, shutter controller, electronic flash controller, automatic exposure (AE) portion (not shown), etc. are also connected to the CPU 11, which controls the operation of the camera as a whole by controlling these elements.

A check starting transistor 14 for starting a battery check is provided. The positive terminal of the battery 13 is connected to the emitter of the transistor 14, and the base of the transistor 14 is connected to a terminal A of the CPU 11 through a resistor. Resistors R1, R2 and R3 are connected in series between the collector of the transistor 14 and ground, and a switching transistor 15 for switching the judging level in the red-eye preventing mode is provided between the resistors R1 and R2 with the collector connected to the connecting point therebetween. The emitter of the transistor 15 is connected to ground and the base thereof is connected to a terminal B of the CPU 11. A comparator 16 for judging the battery level is provided. The positive input terminal thereof is connected between the resistors R2 and R3, and the reference voltage Vref is supplied to the negative input terminal thereof. The output terminal of the comparator 16 is connected to a terminal C of the CPU 11.

According to this checking circuit, when the output at the terminal A of the CPU 11 is a Low level, the check starting transistor 14 is turned on, whereby the voltage of the battery 13 is applied to the series resistors R1 to R3. At ordinary time, the voltage divided by the resistors R1, R2 and R3 is supplied to the positive input terminal of the comparator 16, and the comparator 16 compares the divided voltage with the reference voltage Vref. If the divided voltage of the battery is higher than the reference voltage Vref, the capacity (electric power) is judged to be sufficient and the output of a High level is supplied from the comparator 16 to the terminal C of the CPU 11. On the other hand, if the divided voltage is lower than the reference voltage Vref, the capacity is judged to be insufficient and the output of a Low level is supplied from the comparator 16 to the terminal C of the CPU 11.

When the red-eye preventing mode is selected, the CPU switches the output at the terminal B over to the output of a High level so as to turn on the switching transistor 15. By this operation, the connecting point between the resistors R1 and R2 is connected to ground, and the voltage of the battery 13 is divided by the resistors R2 and R3. If the voltage of the battery 13 is assumed to be constant, the voltage lower than the divided voltage at ordinary time is supplied to the comparator 16. Therefore, the capacity is judged to be insufficient unless the battery capacity is higher than that at ordinary time. That is, the judging level is set at a higher level.

Figure 3:
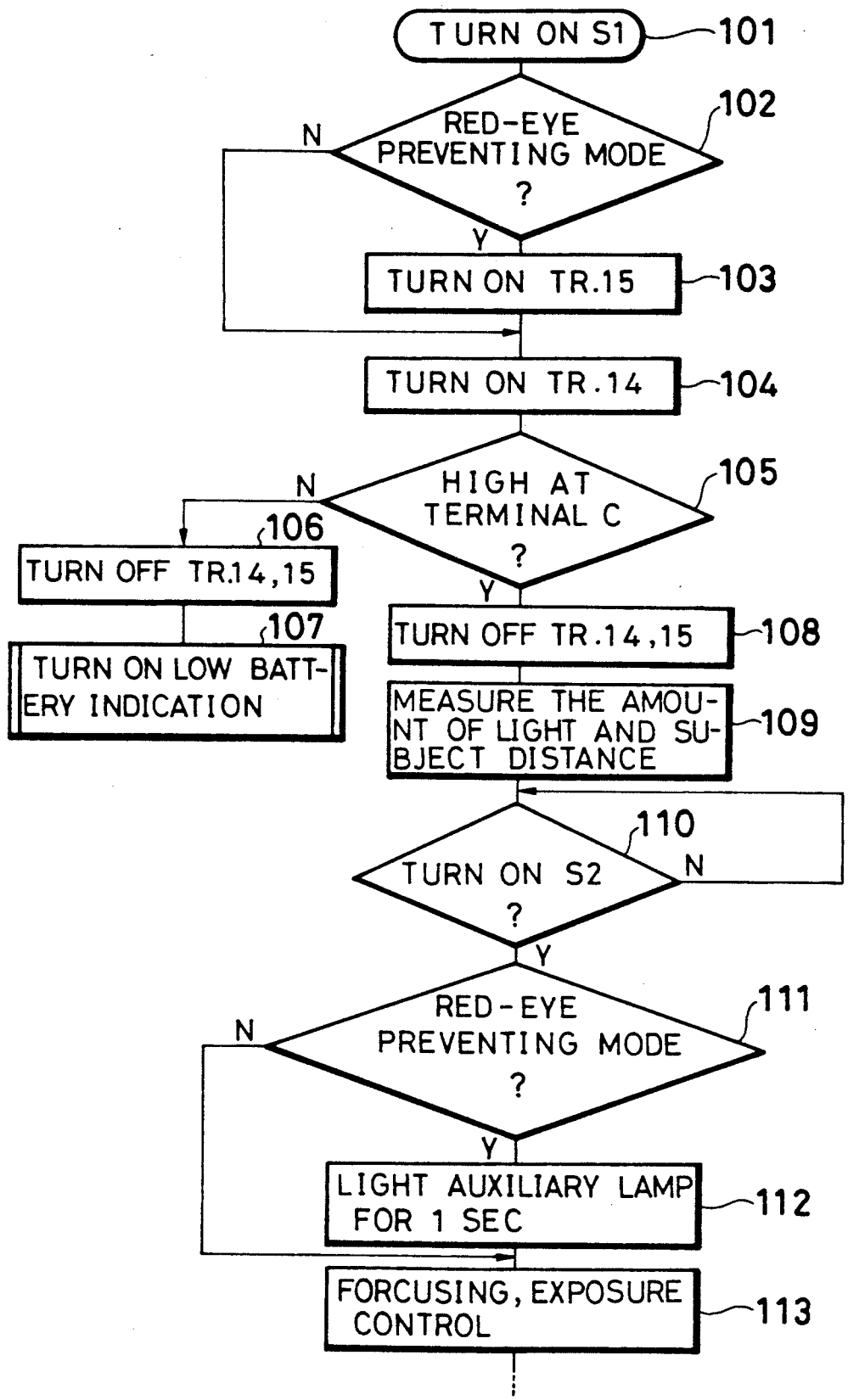
FIG. 3 is a flowchart of the operation of the first embodiment.

The operation of the first embodiment having the above-described structure will now be explained with reference to FIG. 3. In FIG. 3, when the first switch S1 of the shutter button 8 is turned on at step 101, judgment is made as to whether or not the red-eye preventing mode is selected by the electronic flash mode selector switch 9 at step 102. If the answer is "N", the process proceeds to step 104. If the answer is "Y", the switching transistor (TR) 15 is turned on by the CPU 11 at step 103. At step 104, the check starting transistor (TR) 15 is turned on by the CPU 11, and the process proceeds to step 105. In this embodiment, the judging level for a battery check is determined by whether or not the step 103 is executed, namely, whether or not the switching transistor 15 is turned on. If the red-eye mode is not selected, a high divided voltage is supplied from the battery 13 to the comparator and a battery check is carried out at a low judging level. On the other hand, in the red-eye preventing mode, a low divided voltage is supplied from the battery 13 to the comparator 16, and a battery check is carried out at a high judging level.

At step 105, whether or not the output of the comparator 16 (the input at the terminal C of the CPU 11) is a High level is judged, and if the answer is "N", the capacity of the battery 13 is judged to be insufficient. The process proceeds to step 106, and the transistors 14 and 15 are turned off. At step 107, a low battery indicator is turned on. On the other hand, if the answer is "Y" at step 105, the capacitor of the battery 13 is judged to be sufficient. The transistors 14 and 15 are turned off at step 108, and the amount of light and the subject distance are measured for the purpose of focusing control and exposure control at step 109.

At step 110, judgment is made as to whether or not the second switch S2 (release switch) of the shutter button 8 is turned on, and if the answer is "Y", the process proceeds to step 111. At step 111, whether or not the red-eye preventing mode is selected is judged, and if the answer is "N", the process proceeds to step 113 for focusing control and exposure control. On the other hand, if the answer is "Y" at step 111, the auxiliary lamp 7 is lit for about 1 sec at step 112. At step 113, an electronic flash is emitted under focusing control and exposure control, and after the photographing is finished, the film is fed. In this way, when the red-eye preventing mode is selected, a battery check is carried out at a high level, thereby maintaining not only the light emission from the auxiliary lamp 7 but also the subsequent operations.

In this embodiment, the reference voltage Vref of the comparator 16 is made constant and the input battery voltage is changed, but naturally it is possible to switch the reference voltage Vref. It is also possible not to use the comparator, and convert the voltage of the battery 13 into digital data by an A/D converter and to compare the digital data with the reference voltage in the CPU 11.

Second Embodiment

Figure 4:
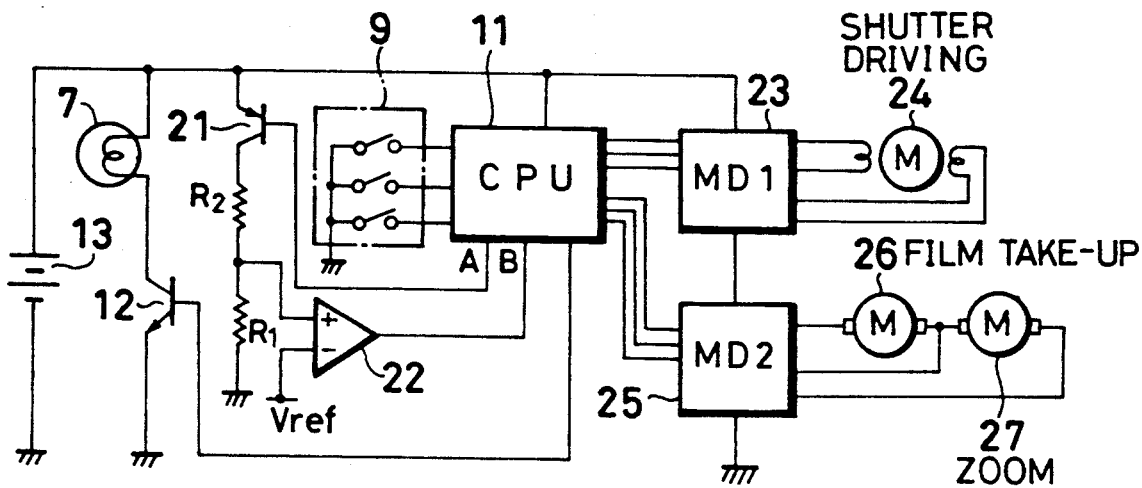
FIG. 4 is a circuit block diagram of a second embodiment of a control circuit for a camera having an auxiliary light source according to the present invention.

FIG. 4 shows the structure of a second embodiment of a control circuit for a camera having an auxiliary light source according to the present invention. The entire structure of the camera is the same as that in the first embodiment shown in FIG. 2. In FIG. 4, the CPU (central processing unit) 11 for controlling the entire operation of the camera is provided with the auxiliary lamp 7 through the switching transistor 12, and the battery 13 is connected to the other side of the auxiliary lamp 7. The electronic flash mode selector switch 9 is connected to the CPU 11 in such a manner that the signal selected by the electronic flash mode selector switch 9 is input to the CPU 11.

A check starting transistor 21 for starting a battery check is provided. The positive terminal of the battery 13 is connected to the emitter of the transistor 21, and the base of the transistor 21 is connected to the terminal A of the CPU 11. The resistors R1 and R2 are connected in series between the collector of the transistor 14 and ground, and a divided voltage of the battery 13 is fetched from the connecting point of the resistors R1 and R2. A comparator 22 for judging the battery level is provided. The divided voltage at the connecting point between the resistors R1 and R2 are supplied to the positive input terminal of the comparator 22, and the reference voltage Vref is supplied to the negative input terminal thereof. The output terminal of the comparator 22 is connected to the terminal B of the CPU 11.

Figure 5:
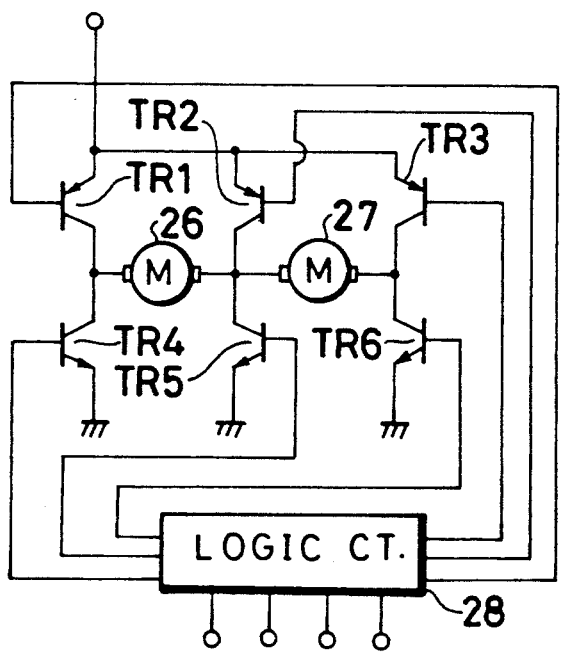
FIG. 5 is a circuit diagram of the second driver circuit in the embodiment shown in FIG. 4.

A first driver circuit 23 for driving a shutter driving pulse motor 24, and a second driver circuit 25 for driving a film take-up motor 26 and a zoom motor 27 are connected to the CPU 11. FIG. 5 shows the detailed circuit structure of the second driver circuit 25. The circuit is an H bridge circuit composed of transistors TR1 to TR6 surrounding the film take-up motor 26 and the zoom motor 27. The on/off operations of these transistors TR1 to TR6 are controlled by a logic circuit 28 to which the bases of these transistors TR1 to TR 6 are connected.

When the transistors TR1 to TR5 are turned on by the logic circuit 28, the film take-up motor 26 is rotated, and when the transistors TR2 and TR6 are turned on, the zoom motor 27 is rotated. When the transistors TR1 to TR3 are turned off and the transistors TR4 to TR6 are turned on, the take-up motor 26 and the zoom motor 27 assume a braked state. In this braked state, a base current of about 30 to 50 mA is supplied to each of the transistors TR4 to TR6 in order to drop the saturation voltage between the collector and the emitter thereof. In this case, it is possible to apply a dummy current of about 90 to 150 mA in total from the three transistors TR. The first driver circuit 23 has a similar structure. In the braked state, it is possible to apply a dummy current of about 60 to 100 mA.

According to this circuit structure, when the output at the terminal A of the CPU 11 is a Low level, the check starting transistor 21 is turned on, and the voltage of the battery 13 is applied to the series resistors R1 and R2. Simultaneously, the first driver circuit 23 brakes the shutter driving pulse motor 24 at ordinary time so as to apply a dummy current of about 60 to 100 mA. On the basis of the thus-dropped voltage, the capacity of the battery 13 is checked..That is, the divided voltage of the battery voltage which is dropped by the dummy current is supplied to the positive input terminal of the comparator 22, which compares the supplied voltage with the reference voltage Vref of the comparator 22. When the divided voltage of the battery 13 is higher than the reference voltage Vref, the capacity (electric power) is judged to be sufficient, and the output of a High level is supplied from the comparator 22 to the terminal B of the CPU 11. When the divided voltage of the battery 13 is lower than the reference voltage Vref, the capacity is judged to be insufficient, and the output of a Low level is supplied from the comparator 22 to the terminal B of the CPU 11.

On the other hand, when the red-eye preventing mode is selected, the CPU 11 causes the second driver circuit 25 to brake the film take-up motor 26 and the zoom motor 27 in addition to the shutter driving pulse motor 24 braked by the first driver circuit 23 and to apply a dummy current of 90 to 150 mA. The voltage of the battery 13 is therefore dropped by the dummy current which is larger than that at ordinary time, and the battery voltage is checked on the basis of the divided voltage.

Figure 6:
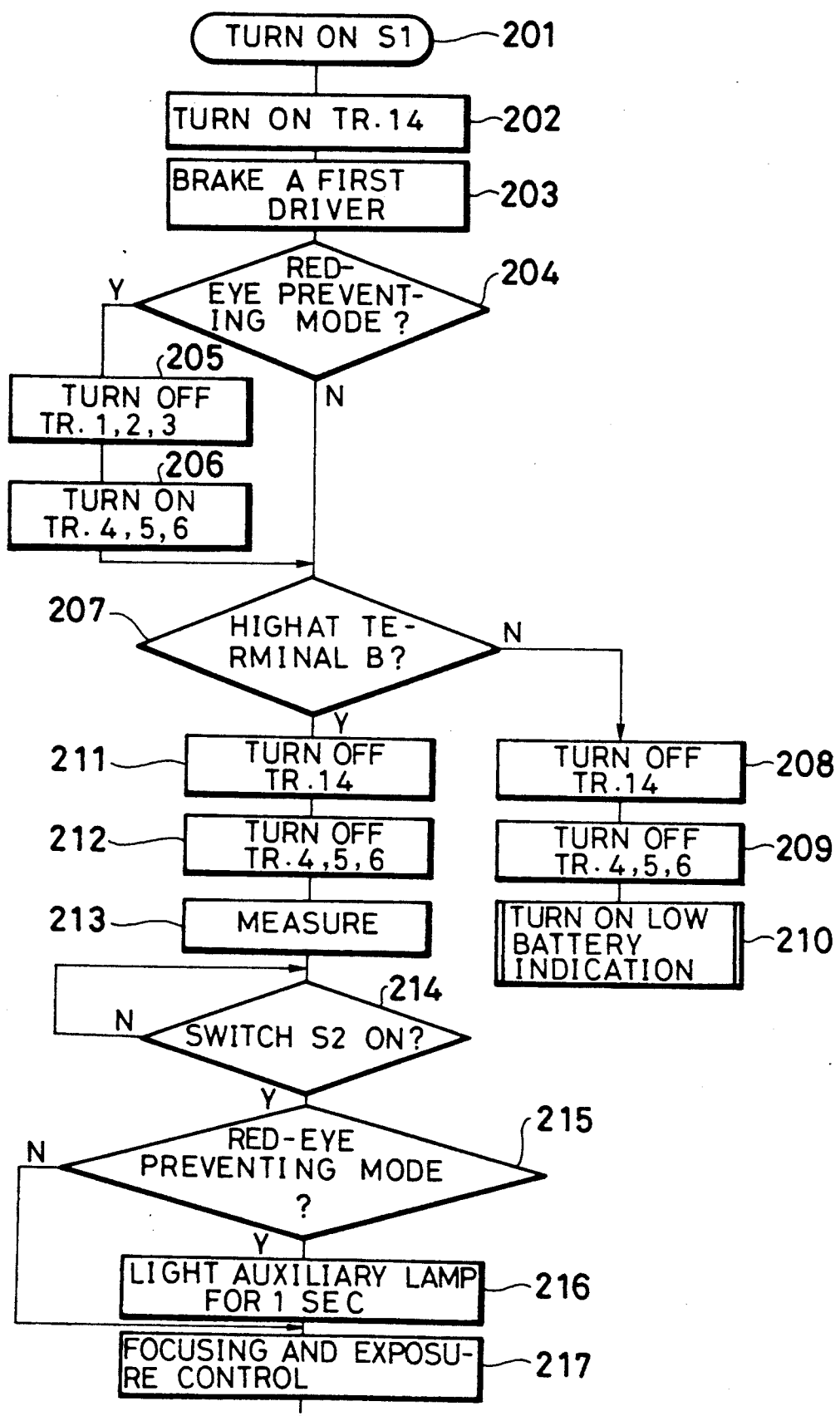
FIG. 6 is a flowchart of the operation of the second embodiment.

The operation of the second embodiment having the above-described structure will now be explained with reference to FIG. 6. In FIG. 6, when the first switch S1 of the shutter button 8 is turned on at step 201, the check starting transistor 21 is turned on at step 202, and the first driver circuit 23 brakes the shutter driving pulse motor 24 at step 203. At step 204, judgment is made as to whether or not the red-eye preventing mode is selected by the electronic flash mode selector switch 9. If the answer is "N", the process proceeds to step 207. If the answer is "Y", the process proceeds to step 205 and the transistors TR1 to TR3 are turned off, and the transistors TR4 to TR 6 are turned on at step 206 so as to brake the film take-up motor 26 and the zoom motor 27. In this way, at ordinary time, a battery check is carried out in a state in which a dummy current to the shutter driving pulse motor 24 is flowing. On the other hand, in the red-eye preventing mode, a battery check is carried out at a high judging level in the state in which a dummy current to the film take-up motor 26 and the zoom motor 27 is flowing in addition to the dummy current in the first driver circuit 23.

At step 207, whether or not the output of the comparator 22 (the input at the terminal B of the CPU 11) is a High level is judged, and if the answer is "N", the capacity of the battery 13 is judged to be insufficient. The process proceeds to step 208 and the transistor 21 is turned off. At step 209, the transistors TR4 to TR6 in the second driver circuit 25 are turned off, and at the subsequent step 210 a low battery indicator is turned on. On the other hand, if the answer is "Y" at step 207, the capacitor of the battery 13 is judged to be sufficient. The transistor 21 is turned off at step 221 and the transistors TR4 to TR6 in the second driver circuit 25 are turned off. At step 213, the amount of light and the subject distance are measured for the purpose of focusing control and exposure control.

At step 214, judgment is made as to whether or not the second switch S2 (release switch) of the shutter button 8 is turned on, and if the answer is "Y", the process proceeds to step 215. At step 213, whether or not the red-eye preventing mode is selected is judged, and if the answer is "N", the process proceeds to step 217 for focusing control and exposure control. On the other hand, if the answer is "Y" at step 215, the auxiliary lamp 7 is lit for about 1 sec at step 216. At step 213, an electronic flash is emitted under focussing control and exposure control, and after the photographing is finished, the film is fed. In this way, when the red-eye preventing mode is selected, a battery check is carried out at a high level by increasing the dummy current, thereby maintaining not only the light emission from the auxiliary lamp 7 but also the subsequent operations.

In the second embodiment, the dummy current to the film take-up motor 26 and the zoom motor 27 is applied, but only the dummy current to either of the motors 26 and 26 may be applied. In addition, the combinations of the motors driven at ordinary time and at the red-eye preventing mode may be different from those in the second embodiment.

As described above, according to the first and second embodiments, even if an auxiliary light source is accommodated in a camera, not only is good preliminary flashing possible but also the subsequent operations of the camera such as electronic flashing and film feeding are secured, thereby enabling effective use of the battery.

Third Embodiment

Figure 7:
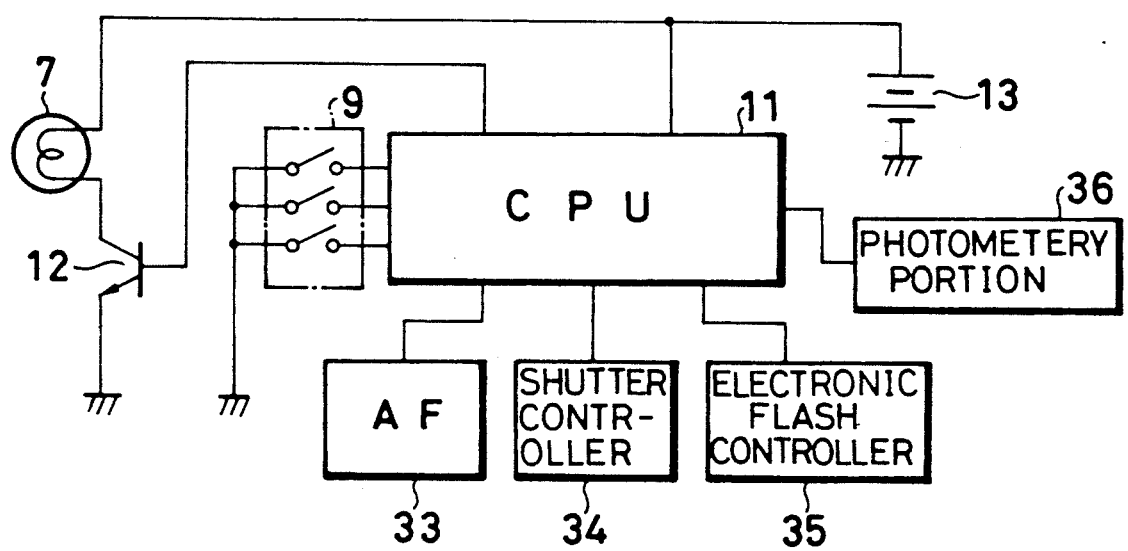
FIG. 7 is a circuit block diagram of a third embodiment of a control circuit for a camera having an auxiliary light source according to the present invention.

FIG. 7 shows the structure of a third embodiment of a control circuit for a camera having an auxiliary light source according to the present invention. In FIG. 7, an autofocusing (AF) portion 33, a shutter controller 34, an electronic flash controller 35 and a photometry portion 36 having a photoelectric transducer for automatic exposure (AE) are connected to the CPU (central processing unit) 11, which controls the operation of the camera as a whole by controlling these elements. A battery source 17 is connected to one side of the auxiliary light source (lamp) 7, and the switching transistor 12 driven by the CPU 11 is connected to the other side of the auxiliary lamp 7. The electronic flash mode selector switch 9 is also connected to the CPU 11 in such a manner that the signal selected by the electronic flash mode selector switch 9 is input to the CPU 11.

The AF portion 33 executes passive autofocusing control by using a line sensor such as a CCD, and the shutter controller 34 controls the opening of the shutter sector in accordance with the operation of the shutter button 8. The electronic flash controller 35 controls the light emission of an electronic flash equipment in a low-luminance state, and the photometry portion 36 measures the luminance of the object when the first switch S1 of the shutter button 8 is turned on. At the time of the autofocusing control by the AF portion 33, when the photometry portion 36 detects that the object is in a low-luminance state, light is caused to emit from the auxiliary lamp 7 by the CPU 11, and autofocusing control is carried out under the auxiliary light. When the red-eye preventing mode is selected by the electronic flash mode selector switch 9, the CPU 11 also causes the auxiliary lamp 7 to emit a preliminary electronic flash before electronic flashing for photographing. The preliminary electronic flash belittles or prevents the red-eye phenomenon.

Figure 8:
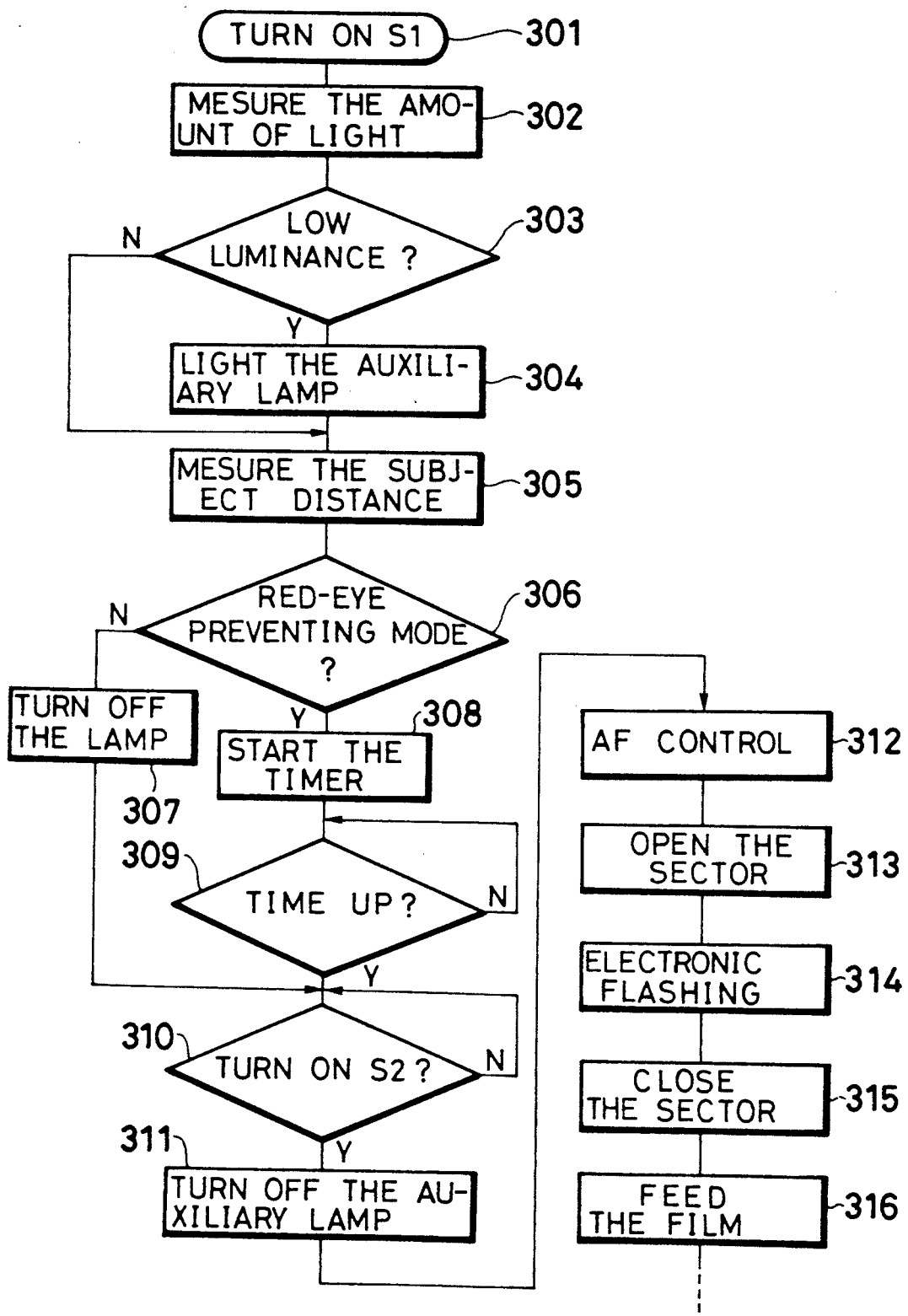
FIG. 8 is a flowchart of the operation of the third embodiment.

The operation of the third embodiment having the above-described structure will now be explained with reference to FIG. 8. In FIG. 8, when the first switch S1 of the shutter button 8 is turned on at step 301, the photometry portion 36 measures the amount of light at step 302. At step 303, judgment is made as to whether or not the object is in a low-luminance state, and if the answer is "N", the process proceeds to step 305. If the answer is "Y", namely, if the object is in a low-luminance state, the process proceeds to step 304 and the auxiliary lamp 7 is lit for several hundred ms, which enables passive autofocusing control. At the subsequent step 305, the subject distance is measured for the purpose of autofocusing control.

At step 306, judgment is made as to whether or not the red-eye preventing mode is selected by the electronic flash mode selector switch 9. If the answer is "N", the process proceeds to step 307 and the auxiliary lamp 7 is turned off at the end of the light emission for several hundred ms. On the other hand, if the answer is "Y", a timer for about 1 sec is started at step 308 so as to continue the light emission started at step 304. At step 309, whether or not the time is up is judged. When it is detected that about 1 sec has elapsed from the lighting of the auxiliary lamp 7, the process proceeds to step 310 and judgment is made as to whether or not the second switch S2 is on. If the answer is "Y", the auxiliary lamp 7 is turned off at step 311.

Thus, in this embodiment, when the red-eye preventing mode is not selected, an auxiliary electronic flash is emitted for several hundred ms in a low-luminance state under autofocusing control, and when the red-eye preventing mode is selected, the electronic flashing operation is continued for the purpose of preliminary electronic flashing, thereby emitting auxiliary electronic flash and preliminary electronic flash for about 1 sec in total.

At step 312, focusing is carried out under autofocusing control by the AF portion 33, whereby the lens is set at a predetermined position. At step 313, the sector is opened by the shutter controller 34 and at step 314, light is emitted from the xenon tube by the electronic flash controller 35. When the electronic flashing is finished, the sector is closed at step 315 and the film is fed by one frame at step 316.

In this embodiment, when the object is detected to be in a low-luminance state at step 303, auxiliary light for passive autofocusing is emitted, and thereafter when it is judged that the red-eye preventing mode is selected at step 306, the light emission is continued for the purpose of preliminary electronic flashing. However, the process is not restricted thereto, and after the end of the auxiliary electronic flashing, light may be emitted separately therefrom for the purpose of preliminary electronic flashing. It is also possible that after judgment is made as to whether or not the red-eye preventing mode is selected, judgment is made as to whether or not the object is in a low-luminance state.

As described above, according to the third embodiment, both preliminary electronic flash for preventing the red-eye phenomenon and auxiliary electronic flash for passive autofocusing can be emitted from only one auxiliary light source with good efficiency. Thus, it is possible to produce a highly functional camera.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A control circuit for a camera having an auxiliary light source comprising:

an auxiliary light source, provided separately from an electronic light source, which emits light so as to prevent red-eye phenomenon;

a CPU for controlling the entire operation of said camera for controlling driver circuits for braking a predetermined motor of said camera during the battery voltage check in the ordinary mode, and for controlling driver circuits for braking another motor in addition to said motors during the battery voltage check in the red-eye preventing mode as a result of applying a dummy current to said driver circuits;

a transistor for starting a battery check by said CPU; and a comparator for judging the battery capacity by using the battery voltage during braking said predetermined motor in ordinary mode and by using the battery voltage at the state of braking another motor in addition to said predetermined motors in the red-eye prevent mode.

2. A control circuit for a camera having an auxiliary light source according to claim 1, wherein a comparison means is installed in the CPU for comparing, and said CPU converts the value of the battery voltage braking of said motors into digital data, and said comparison means compares said voltage data and reference voltage data.

* * * * *